United States Patent
Huang

[19]

[11] Patent Number: 5,618,740
[45] Date of Patent: Apr. 8, 1997

[54] METHOD OF MAKING CMOS OUTPUT BUFFER WITH ENHANCED ESD RESISTANCE

[75] Inventor: Tiao-Yuan Huang, Cupertino, Calif.

[73] Assignee: VLSI Technology, Inc., San Jose, Calif.

[21] Appl. No.: 636,552

[22] Filed: Apr. 23, 1996

Related U.S. Application Data

[62] Division of Ser. No. 316,313, Sep. 30, 1994, Pat. No. 5,517,049.

[51] Int. Cl.$^6$ ................................................ H01L 21/8238
[52] U.S. Cl. ........................ 438/224; 438/231; 438/232
[58] Field of Search .......................... 437/34, 35, 44, 437/56, 57, 58, 59

[56] References Cited

U.S. PATENT DOCUMENTS

| | | | |
|---|---|---|---|
| 4,894,694 | 1/1990 | Cham et al. | 217/345 |
| 5,262,344 | 11/1993 | Mistry | 437/34 |
| 5,272,097 | 12/1993 | Shiota | 437/57 |
| 5,416,036 | 5/1995 | Hsue | 437/44 |
| 5,529,941 | 6/1996 | Huang | 437/34 |

FOREIGN PATENT DOCUMENTS

| | | | |
|---|---|---|---|
| 0071335 | 2/1983 | European Pat. Off. | 257/345 |
| 62-122262 | 6/1987 | Japan | 257/369 |
| 2-292857 | 12/1990 | Japan | 257/369 |
| 5-315561 | 11/1993 | Japan | 257/369 |

*Primary Examiner*—Chandra Chaudhari
*Attorney, Agent, or Firm*—Clifton L. Anderson

[57] ABSTRACT

The present invention provides a CMOS integrated circuit in which core transistors are provided with punch-through pockets, while the input/output transistors are not provided with punch-through pockets. Punch-through protection for the input/output transistors by virtue of their larger dimensions. The pockets, like lightly doped drains, are formed after the gates are formed but before the formation of gate sidewalls. However, the input/output are masked during the punch-through implants, but are unmasked for at least one of the lightly doped drain implants. The absence of pockets on the input/output transistors enhances their ESD resistance, and thus the ESD resistance of the incorporating integrated circuit.

5 Claims, 8 Drawing Sheets

METHOD OF MAKING CMOS OUTPUT BUFFER WITH ENHANCED ESD RESISTANCE

This is a divisional application of allowed U.S. patent application Ser. No. 08/316,313, filed Sep. 30, 1994 and now U.S. Pat. No. 5,517,049.

BACKGROUND OF THE INVENTION

The present invention relates to integrated circuits and, more particularly, to output structures for CMOS integrated circuits. A major objective of the present invention is to enhance the resistance of dense CMOS integrated circuits to electrostatic discharge.

Much of modern progress is associated with the increasing circuit density and speeds of integrated circuits. Integrated circuits rely heavily on transistors as their primary functional units. CMOS (Complementary Metal-Oxide-Silicon) transistors use complementary NMOS and PMOS field-effect transistors in tandem to minimize power requirements and, accordingly, heat generation. Heat generation becomes an increasingly serious problem for dense integrated circuits since local heat accumulation can damage the circuit. CMOS technology provides for denser integrated circuits by minimizing this heat accumulation. Furthermore, the low CMOS power requirements are attractive for portable applications and, more generally, for energy conservation.

Each field-effect transistor includes a source, a drain, a channel, and a gate. The voltage at the gate controls the conductivity of the channel and thus controls the current between the source and the drain. Most commonly, the source, drain, and channel, are defined in a monocrytalline silicon substrate. In the case of NMOS transistors, the source and the drain are heavily doped with n-type dopant so that electrons are the majority carriers. In the case of PMOS transistors, the source and the drain are heavily doped to p-type dopant so that holes (absent electrons) are the majority carriers. Typically, the gate is of heavivity doped polycrystalline silicon and is electrically insulated from the channel by a silicon dioxide "gate oxide" layer.

Each increase in circuit density is made possible by reductions in the minimum dimensions with which transistor elements can be defined. Circuit density is typically indicated by the design source-to-drain channel length. Early integrated circuits had dimensions measured in multiple microns. More recently submicron technologies have been developed to the point where commercial integrated circuits are being made with channel lengths well below 0.5 microns. Typically, most length and width dimensions scale roughly proportionally to channel length; thicknesses also tend to scale, but less proportionally.

As their dimensions fall, transistors become more affected by unintended electrical phenomena such as ESD, the hot-electron effect, and punch-through. The most notorious of these unintended electrical phenomena is electron-static discharge (ESD). ESD arises as accumulated charge jumps from one object to another, causing dielectric or junction breakdown. Lightning is a dramatic instance of ESD, but many people are familiar with it as the sparks that are generated when reaching for a metal object after shuffling across a carpet. Even in its more mundane form, ESD can wreak havoc on the tiny circuit elements of an integrated circuit. In fact, an ESD can cause the gate oxide to break down, destroying the integrated circuit.

ESD damage is best avoided by taking precautions against charge buildup in the vicinity of an integrated circuit. Systems incorporating integrated circuits must include proper grounding. People handling integrated circuit are cautioned to ground themselves (for example, using conductive wrist straps coupled to electrical ground). Despite these precautions, ESD can and does affect integrated circuits. Accordingly, integrated circuits are designed with ESD resistance as an objective.

During an ESD event, a transistor suffers a large drain voltage. If this voltage exceeds a first breakdown voltage ($V_{t1}$) for the transistor, a drain current will flow. While the transistor is not functioning as intended during this breakdown, it can still resume normal operation once the ESD event is over. As soon as the current begins flowing, the drain voltage drops. However, if the ESD event is severe enough, a second breakdown voltage $V_{t2}$ is crossed, at which point the transistor is destroyed.

The primary approach to ESD resistance is to provide a large area for the breakdown current to flow. This slows the excursion to $V_{t2}$, which in many cases can mean that the device escapes destruction. The large area can be provided by using larger transistors or multiple transistors in parallel or both. A problem with this approach to ESD resistance is that it runs counter to the general objective of higher density integrated circuits. In practice it can be implemented by applying it to only the most vulnerable transistors.

An integrated circuit can be divided conceptually between core transistors and input/output (I/O) transistors. The core transistors implement the logical design for the circuit, while the I/O transistors manage communications with the incorporating system. Since ESD usually arises from external sources, it is the I/O transistors that most need protection rather than the relatively numerous core transistors. Thus, relatively large and redundant I/O transistors can be used to provide ESD resistance without having a major impact on circuit density.

Not all unintended electric events are externally generated. There is a "hot-electron" effect in which electron hole pairs are generated due to the electric field in the section of the channel near the drain. If this electric field is strong enough, the electrons can inject into the neighboring gate oxide. The hot-electron effect causes the performance of a transistor to degrade over time. This degradation can cause a transistor to fall below specification around which a circuit was designed, causing the circuit to fail.

As device dimensions fell below one micron, the hot-electron effect became a more serious concern. It was dealt with using a lightly-doped drain (LDD) approach in which a lightly doped drain section separates the channel from a heavily doped drain section. This yielded a weaker field at the channel, reducing the likelihood that electrons would inject into the oxide.

Lightly doped drains could be formed as follows. After the gate polysilicon is patterned. A shallow light source/drain implant is made. Oxide sidewalls are then formed on the gates and a deep heavy implant is performed. The heavy doping defines the heavily-doped drain section. The lightly doped background extends beyond the heavily doped drain section to define a lightly doped drain section. Incidentally, the source is also divided into lightly and heavily doped sections. For a CMOS integrated circuit, this procedure is duplicated so that both LDD PMOS and LDD NMOS transistors are formed.

"Punch-through" is an unintended electrical effect that becomes serious when transistor dimensions fall below 0.5 microns. In punch-through, current can flow from source to drain irrespective of the gate voltage. Instead of flowing near the gate oxide, as does the normal source/drain current when the appropriate gate voltage is applied, the punch-through current tends to flow at a deeper level within the channel region.

Punch-through can be inhibited by counter-doping the channel region at the level at which punch-through could occur. A punch-through implant can be formed in several ways. One approach is to implant dopant across the entire channel region at a suitable depth. Such an implant can be performed before the gates are defined. Alternatively, punch-through implants can be performed at about the same stage as the lightly doped drain implants, e.g., after the gates are defined but before sidewalls are formed. In this latter case, the punch-through implant takes the form of counterdoped "pockets" adjacent the sources and drains.

The implants for the punch-through pockets must extend further under the gate than the lightly doped drains. This is not a problem for the NMOS transistors since the p-type dopant, typically boron, used to form the NMOS pockets is much more mobile than the n-type dopant, typically arsenic, used to form the lightly doped drain. The relative mobilities do not work out well for the PMOS transistors. Accordingly, a wide angle implant is used for the n-type pocket dopant so that more of it is implanted under the gate.

While there have been successful approaches to minimizing the harm due to the described unintended electrical effects, the problems they cause are far from being solved. Solutions that are effective at one stage in the development of integrated circuit technology can be strained with further reductions in feature dimensions. This is particularly true of ESD protection, which is weakened as smaller device dimensions require thinner gate oxides. Accordingly, there is still a need for an approach to providing better ESD protection for integrated circuits designed with dimensions below 0.5 microns.

SUMMARY OF THE INVENTION

The present invention provides an integrated circuit in which core transistors include a punch-through implant while the input-output transistors do not have a punch-through implant. It should be noted that more steps may be required to produce such a structure than are required to provide pockets for all transistors. These extra steps are justified by improved ESD resistance.

By way of explanation and not of limitation, it appears that the punch-through pockets have an adverse effect on ESD resistance. The presence of the pocket causes a relatively strong electric field where it bounds the heavily-doped drain section. During an ESD event, the ESD current will be relatively intense in this strong field region. This more intense ESD current can more readily cause permanent damage.

A conflict thus appears between ESD resistance and punch-through resistance. This conflict can be resolved in favor of the punch-through implant for the smaller and more numerous core transistors; it can be resolved in favor of ESD protection for the normally larger and less numerous input/output transistors. Punch-through protection for the input/output transistor is provided by its longer channel. For example, the invention provides for a combination of a core transistor coupled to an output transistor, where the core transistor has pockets and the output transistor does not.

A method in which punch-through pockets are formed can be modified by adding punch-through masks steps between the gate formation and sidewall formation. This permits all transistors to have lightly doped drains, while only the core transistors have punch-through pockets. A method in which the punch-through implant is performed before the gate is defined can be modified by changing the punch-through mask pattern.

The resulting device can have lightly doped drains to protect against the hot-electron effect, the core transistors can have punch-through protection despite being high density, while the input/output transistors provide enhanced ESD protection for the integrated circuit. These and other features and advantages of the present invention are apparent from the description below with reference to the following drawings.

In the drawings, the hatching of the monocrystalline and polycrystalline silicon roughly indicates doping type and concentration. P-type doping is represented by a positive slope and n-type doping is represented by a negative slope. The steepness of the slope roughly correlates with doping concentration. This convention is applied only to semiconductor materials; hatching of conductive and dielectric materials does not reflect conductivity. Elements of silicon dioxide are not hatched.

DESCRIPTION OF THE PREFERRED EMBODIMENTS

Figure 1:
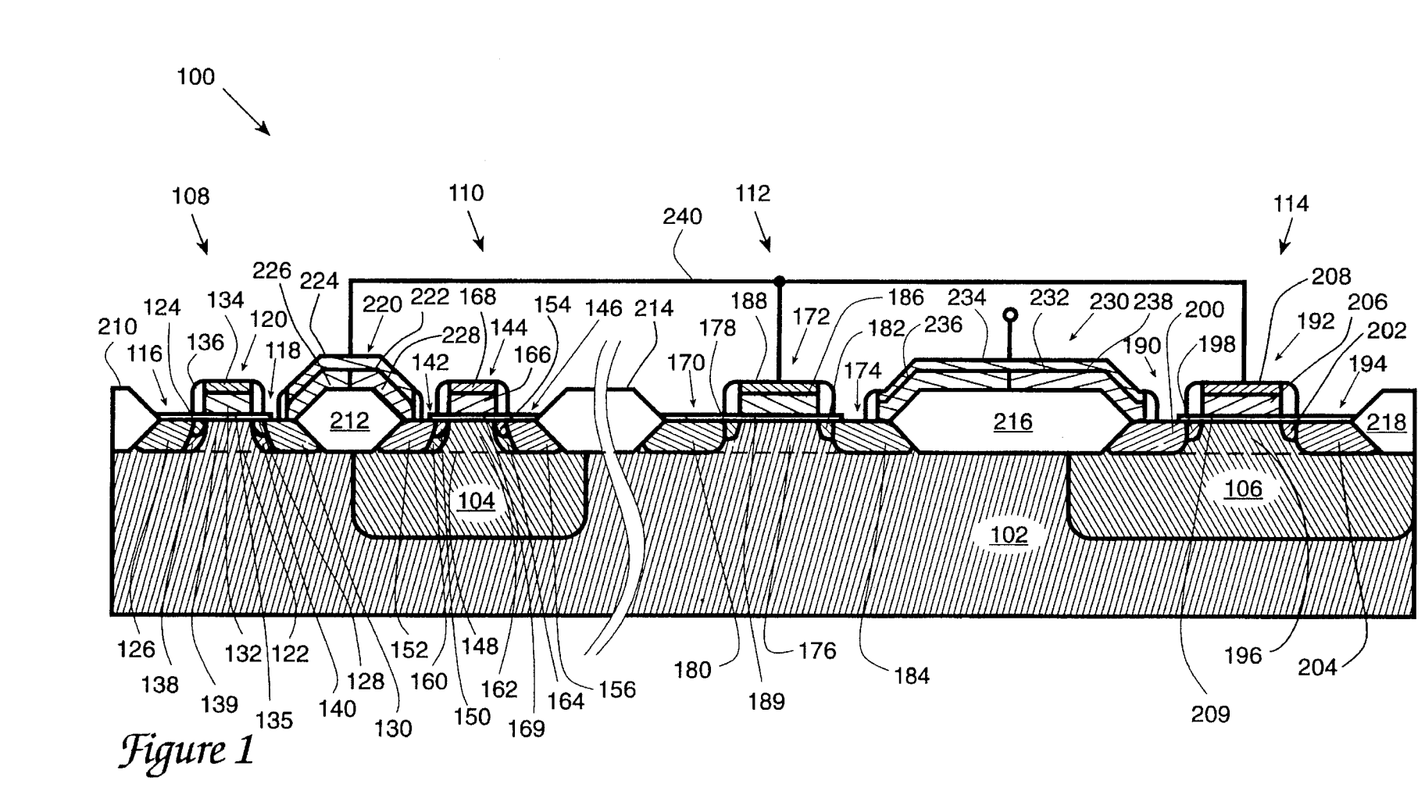
FIG. 1 is an elevational view of portion of an integrated circuit structure in accordance with the present invention.

An integrated circuit structure 100 has a predominantly p-type substrate 102 with n-wells 104 and 106 formed therein, as shown in FIG. 1. Fabricated in and on substrate 102 are a core NMOS (n-channel "metal"-oxide-silicon) transistor 108, a core PMOS (p-channel "metal"-oxide-silicon) transistor 110, an output NMOS transistor 112, and an output PMOS transistor 114. ("Metal" is in quotes because, while aluminum was historically the preferred gate material, today doped polysilicon is commonly used for the gate material.)

Core NMOS transistor 108 includes an NMOS source 116, an NMOS drain 118, an NMOS gate 120, and an n-channel 122 that is below gate 120 and provided by the relative lightly doped p-type substrate 102. NMOS source 116 includes a lightly doped n-type source section 124 and a heavily doped n-type source section 126. NMOS drain 118 includes a lightly doped n-type drain section 128 and a heavily doped n-type drain section 130. NMOS gate 120 then includes a polysilicon layer 132, a tungsten silicide cap 134, a gate oxide 135, and sidewalls 136. The n-channel 122 includes an intermediate channel section 139, and p-type punch-through pockets 138 and 140 that are adjacent to NMOS source 116 and NMOS drain 120.

Core PMOS transistor 110 is formed in n-well 104 and includes a PMOS drain 142, a PMOS gate 144, a PMOS source 146, and an n-type channel 148 that is provided by n-well 104 and is below PMOS gate 144. PMOS drain 142 includes a lightly doped p-type drain section 150 and a heavily doped p-type drain section 152. PMOS source 146 includes a lightly doped p-type source section 154 and a heavily doped p-type source section 156. The n-type channel 148 has an intermediate channel section 162, and n-type punch-through pockets 160 and 164. The PMOS gate 144 includes a polysilicon layer 166, a tungsten silicide cap 168, a gate oxide 169, and sidewalls 136. Actually, core PMOS transistor 110 has the same structure as core NMOS transistor 108 except for the conductivity type.

Unlike CMOS transistors 108 and 110, output CMOS transistors 112 and 114 do not have source and drain pockets. Specifically, NMOS transistor 112 includes an NMOS source 170, an NMOS gate 172, an NMOS drain 174, and a p-type channel 176 provided by the p-type substrate 102. NMOS source 170 includes a lightly doped source section 178 and a heavily doped source section 180 while NMOS drain 174 includes a lightly doped drain section 182 and a heavily doped drain section 184. NMOS gate 172 includes a polysilicon layer 186, a tungsten silicide cap 188, a gate oxide 189, and sidewalls 136.

PMOS transistor 114 is formed in n-well 106. PMOS transistor 114 includes a PMOS drain 190, a PMOS gate 192, a PMOS source 194, and an n-type channel provided by n-well 106. PMOS drain 190 has a lightly doped drain section 198 and a heavily doped drain section 200 while PMOS source 194 includes a lightly doped source section 202 and a heavily doped source section 204. PMOS gate 192 includes a polysilicon layer 206, a tungsten silicide cap 208, a gate oxide 209, and sidewalls 136. Basically, PMOS transistor 114 has the same structure as NMOS transistor 112 except for the conductivity type.

Field oxides 210–218 are grown over the upper surface of the substrate 102 to electrically isolate active regions of CMOS transistors 108, 110, 112 and 114 from each other and from other devices formed in substrate 102. Core NMOS drain 118 and core PMOS drain 142 are electrically coupled via an interconnect 220 over field oxide 212. Interconnect 220 includes a polysilicon layer 222 and a tungsten silicide cap 224. Polysilicon layer 222 is doped n-type over a segment 226 extending over core NMOS transistor 108 and is doped p-type over a segment 228 extending over core PMOS transistor 110. Accordingly, a pn diode junction is defined at the mutual boundary of segments 226 and 228. To short the pn diode junctions in the interconnect, a technique can be used, in which a tungsten silicide cap layer 224 is formed over polysilicon layer 222. Tungsten silicide cap 224 serves to short this diode junction to minimize any impairment of the interconnect 220.

Output NMOS drain 174 and output PMOS drain 190 are also electrically coupled via an interconnect 222 over the field oxide 216. Interconnect 230 includes a polysilicon layer 232 and a tungsten silicide cap 234. Polysilicon layer 232 is doped n-type over a segment 236 extending over output NMOS transistor 112 and is doped p-type over a segment 238 extending over output PMOS transistor 114. A pn diode junction is also formed at the mutual boundary of segments 236 and 238. Tungsten silicide cap 234 serves to short this diode junction to minimize any impairment of the interconnect 230. Oxide sidewalls 136 are formed at the sides of gates 120, 144, 172, and 192 as well as interconnections 220 and 230.

Drain interconnect 220 of core transistors 108 and 110 is electrically coupled to gates 172 and 192 of output transistors 112 and 114 to form an integrated circuit in which core transistors and output transistors are fabricated in the same substrate with electrical coupling. In practice, a polysilicon structure can be patterned to define a conductor 240 that electrically couples output gates 172 and 192 to core drains 118 and 142. Also, interconnect 230 can be electrically coupled to gates of the other output CMOS transistors in substrate 102 to form an output port circuit.

Figure 2:
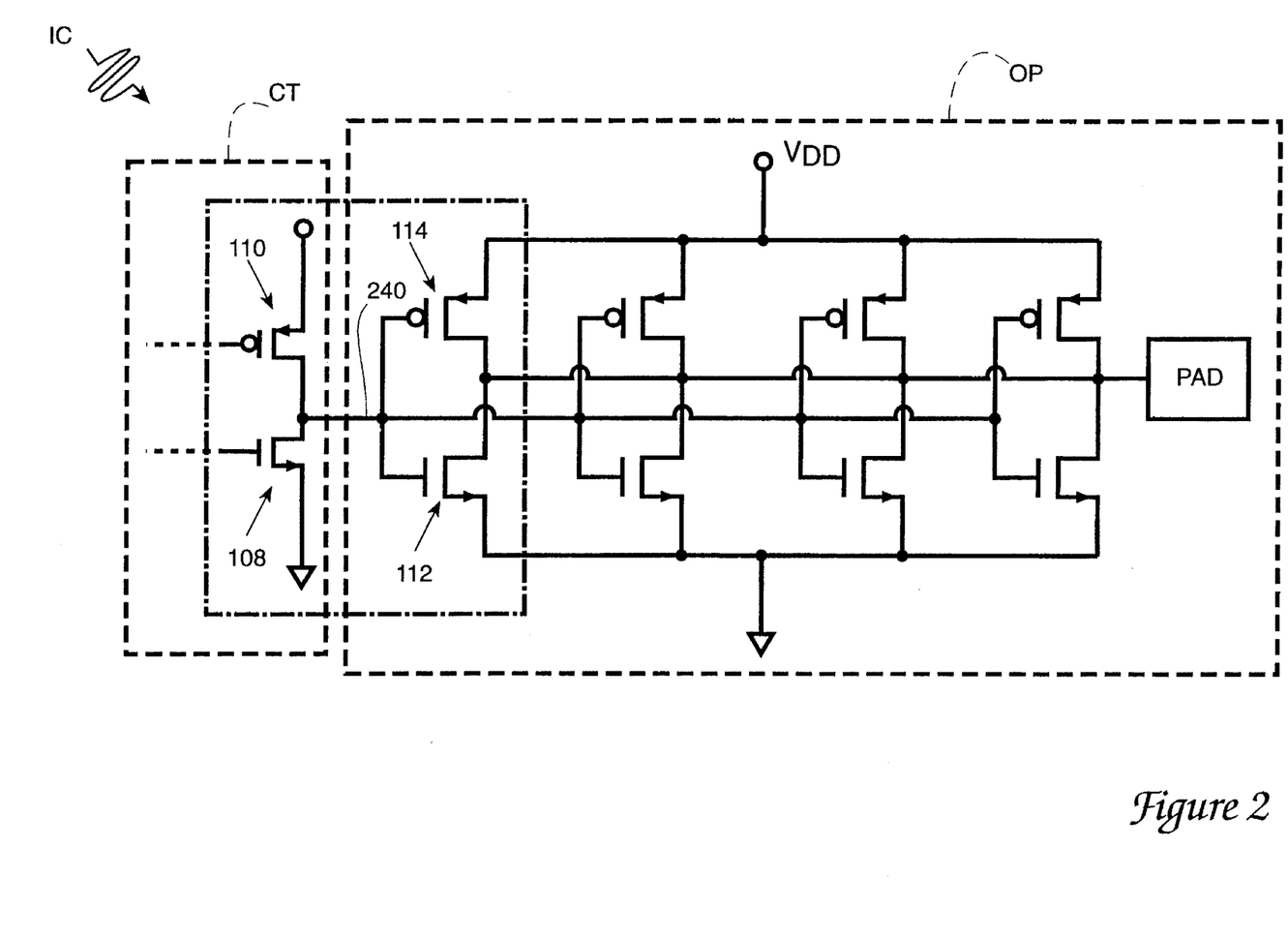
FIG. 2 is a circuit diagram for the integrated circuit structure of FIG. 1.

The circuit diagram for core transistors and output port circuit is shown in FIG. 2. The circuit diagram IC includes a core transistor circuit CT, and an output port circuit OP. Core transistor circuit CT is usually designed to conduct calculation and store data or information; output transistor port OP then functions to transfer the resultant data and information from core transistor circuit CT to peripheral devices.

Core PMOS transistor 110 has its source tied to Vdd (e.g., 3.3 volts) while core NMOS transistor 108 has its source grounded. The drains of both core transistors are connected to the gates of output transistors 112 and 114 by conductor 240 defined by a polysilicon structure. Alternatively, this connection can be made through a metal interconnect structure. Output transistor 112 has its source grounded while the source of output transistor 114 is coupled to Vdd. Also, the drains of output transistors 112 and 114 are coupled to drains of the other output CMOS transistors that have the same structure as output CMOS transistors 112 and 114. Thus, a plurality of so connected output CMOS transistor pairs constitute the output port circuit OP. A pad is connected to the drains of last output CMOS transistor pair to provide output pin assignment.

Figure 3:
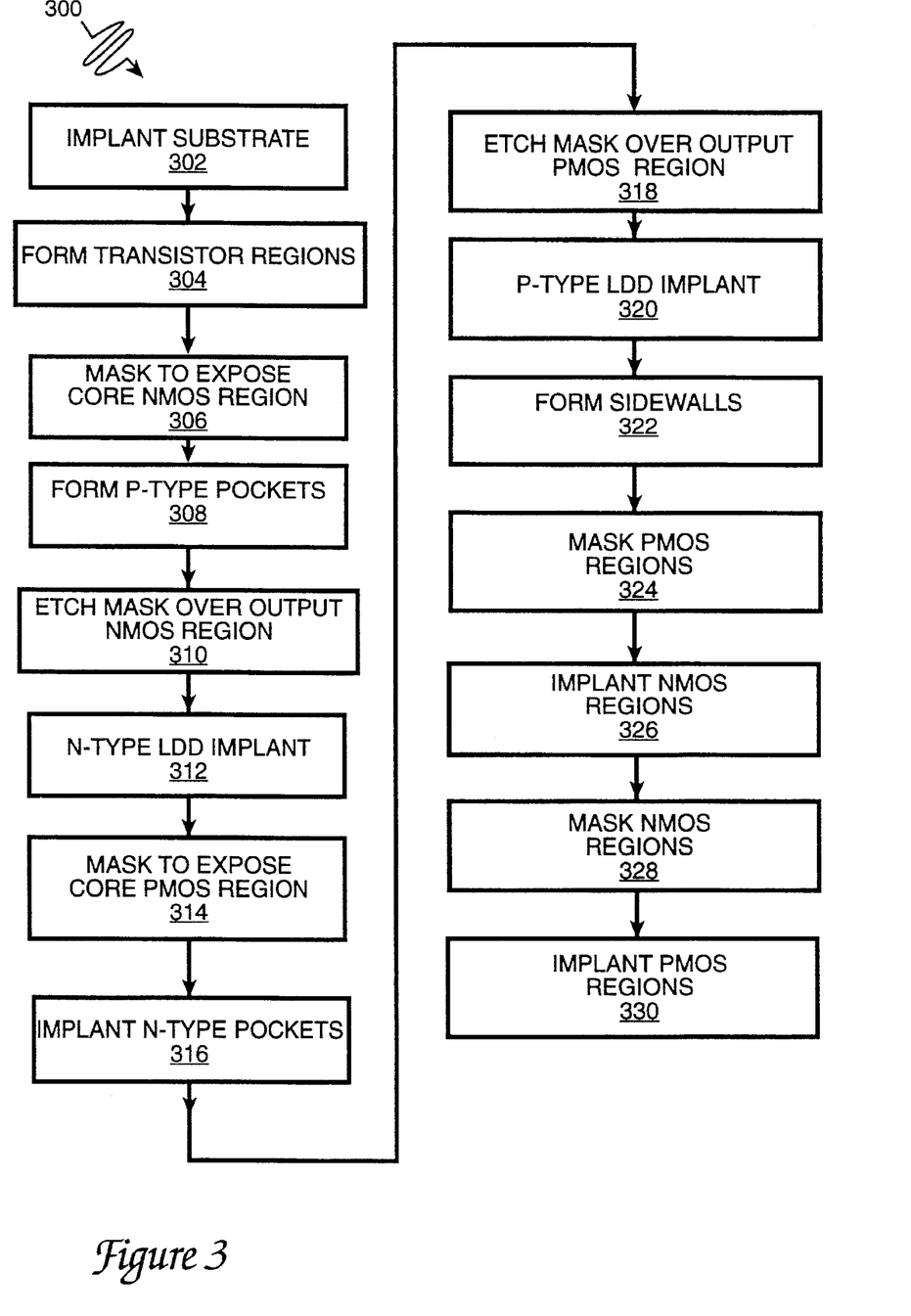
FIG. 3 is a flow chart of a method of fabricating the integrated circuit structure of FIG. I in accordance with the present invention.
Figure 4A:
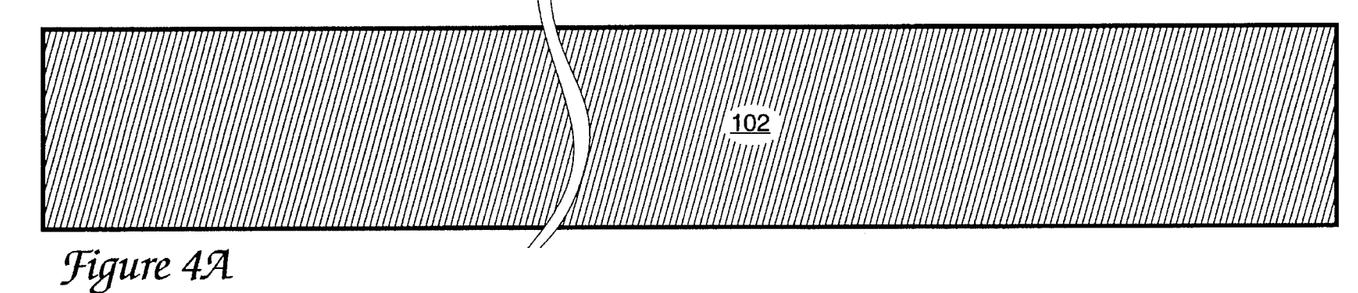
FIGS. 4A–4I are elevational views of the CMOS transistors of FIG. 1 during steps of the method of FIG. 3.
Figure 4B:
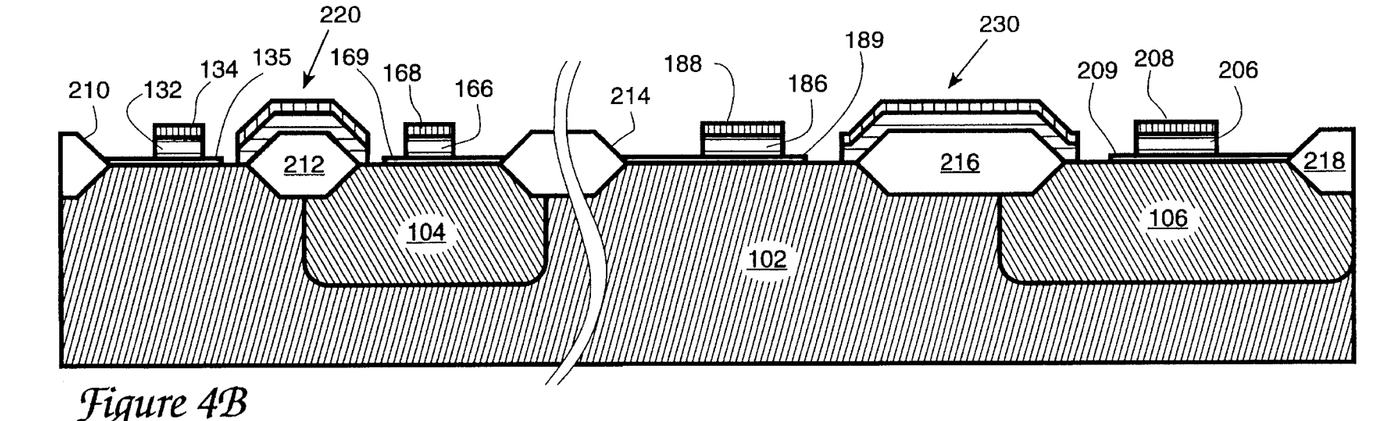

In accordance with the present invention, an integrated circuit 100 is fabricated in accordance with a CMOS method 300, flow charted in FIG. 3. Method 300 begins with a substrate of lightly doped p-type silicon, as shown in FIG. 4A. At step 304, a series of steps is employed to form n-wells 104 and 106, field oxides 210–218, gate oxides 135, 169, 189, and 209, interconnects 220 and 230, "buried contact" etch, and gate polysilicons 132, 166, 186, thereby forming core and output transistor regions as shown in FIG. 4B.

Figure 4C:
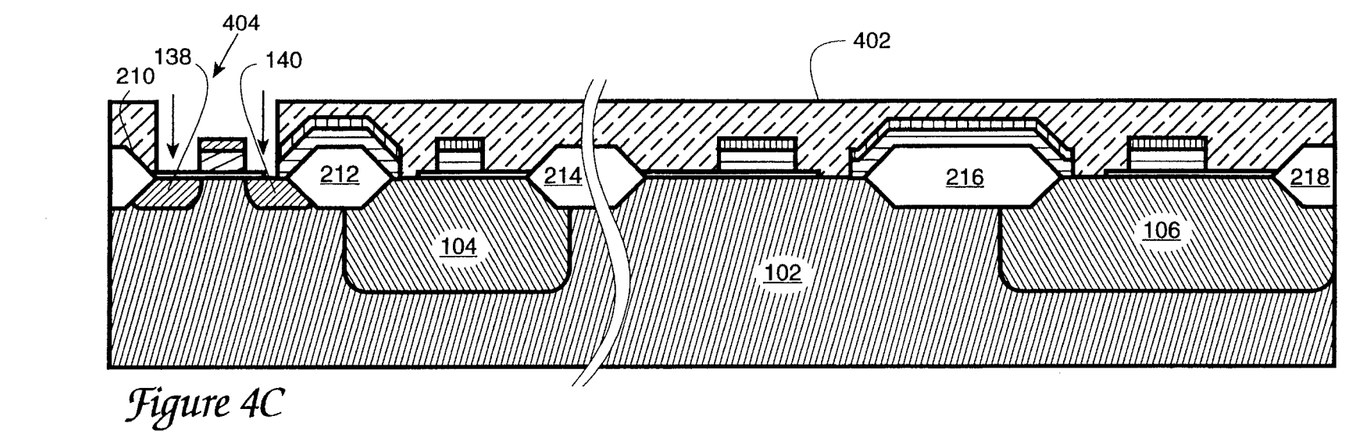

Formed gate length of output transistors is greater than the gate length of the core transistors. Preferably, the gate length of the output transistors is at least 0.1 µm greater than the gate length of the core transistors. More specifically, the gate of output transistors can be 0.5 µm at length while the gate of the core transistors is 0.3 µm at length. Step 306 involves an appropriate masking over the substrate 102 with core NMOS region 404 exposed and a follow step 308 is to conduct a p--implant to form p-type punch-through pockets 138 and 140, as indicated in FIG. 4C.

Figure 4D:
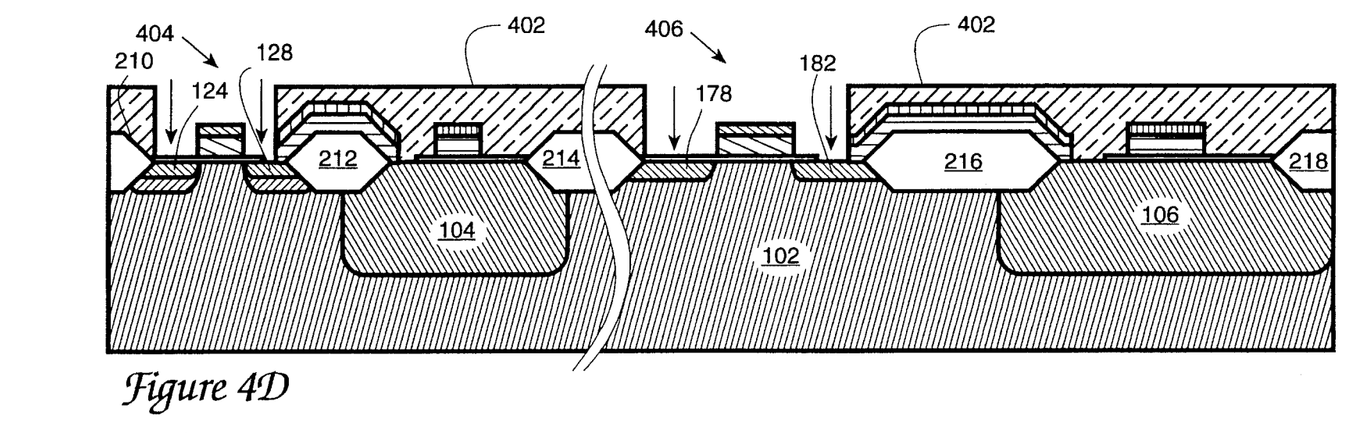

"Lightly doped drain (LDD)" implants may then be performed at step 312 where a portion of photoresist mask 402 that is directly over output NMOS region 406 is removed at step 310 to leave exposed both core and output NMOS regions 404 and 406 for the LDD implant. The LDD implant at step 412 defines a lightly doped n-type source section 124 and a lightly doped n-type drain section 128 within the core NMOS transistor region as well as a lightly doped n-type source section 178 and a lightly doped n-type drain section 182 within the output NMOS transistor region. The result structure is indicated in FIG. 4D. The remained photoresist 402 is then removed.

Figures 4E, 4F:
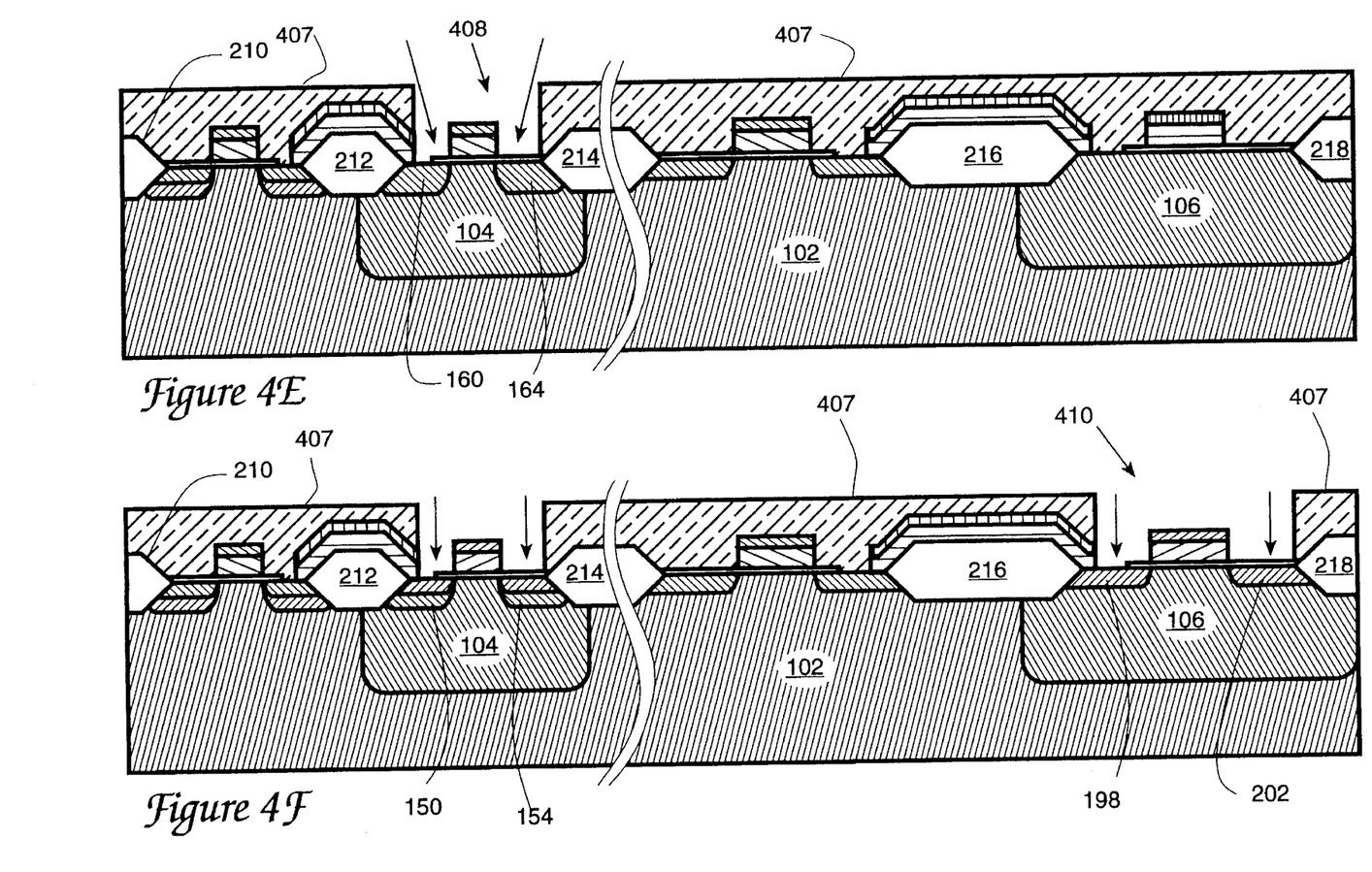

Photoresist masking, at step 314, provides core PMOS region 408 exposed. At step 316, an n--dopant implant is performed at a large angle relative to the normal to upper surface of the substrate 102. In the preferred method, the p-type dopant is boron and the n-type dopant is arsenic. The diffusivity of boron in silicon is much greater than that of arsenic, so the large angle implant is applied to drive n—-dopant into the n-well further to form n-type pockets. This large angle is at least 30° and preferably about 60°. The radically inward portion of the predominantly n-type implant region becomes n-type punch-through pockets 160 and 164, as indicated in FIG. 4E.

An implant of p—-dopant is conducted to form p-type lightly doped source section 154 and drain section 150 of core PMOS transistor 110 and source section 202 and drain section 198 of core PMOS transistor 114, at step 320, followed with the removal of the photoresist masked directly over output PMOS region 410 at step 318. The resulting structure is shown in FIG. 4F.

Figure 4G:
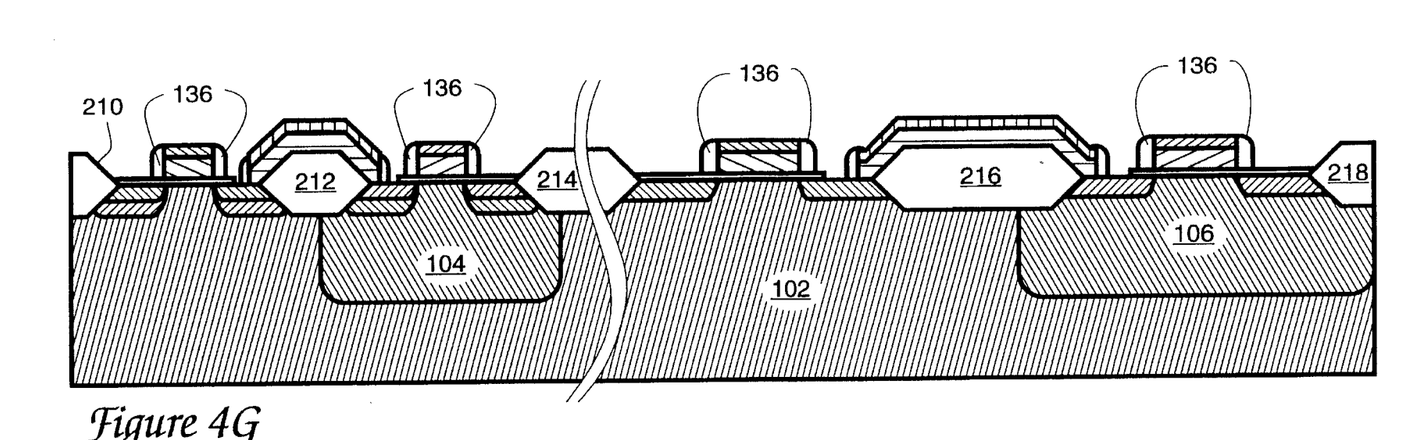

A conformal oxide, such as low pressure chemical vapor deposition (LPCVD) oxide, is deposited over the upper surface of the substrate 102 and a reactive ion etch (RIE) follows, resulting in sidewalls on the exposed sides of the polysilicon and the tungsten silicide, at step 322. The resultant structure is indicated in FIG. 4G.

Figure 4H:
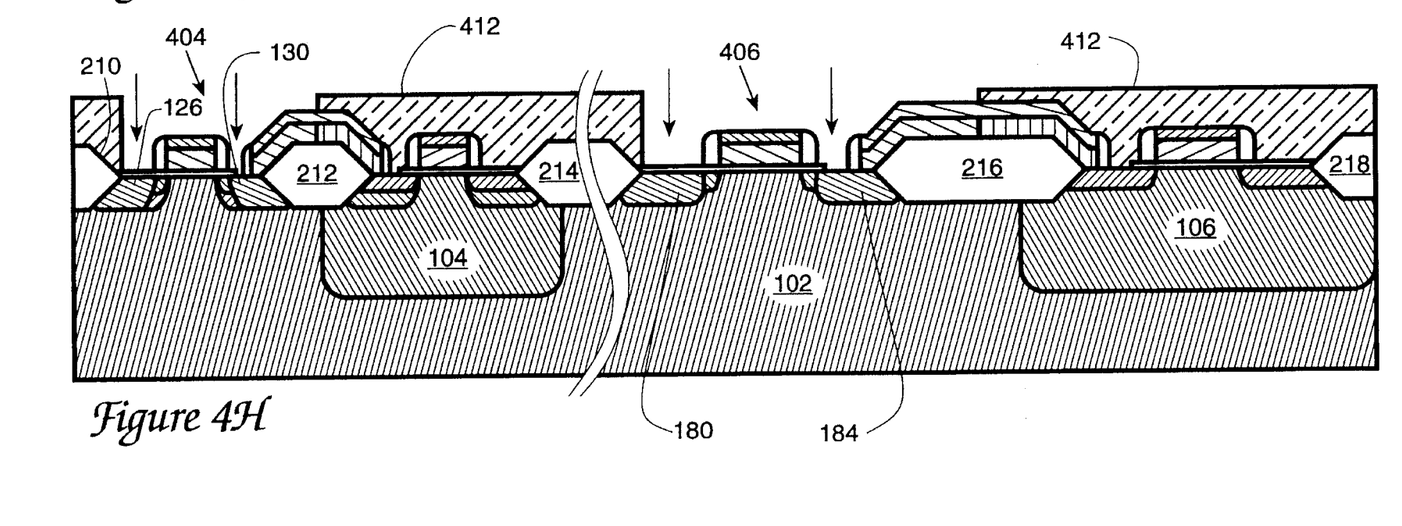

Photoresist 412 is patterned over the substrate 102 to expose the NMOS regions 404 and 406 at step 324. An n+ implants is performed at step 326. A deep and heavy n-type implant yields heavily doped n-type source section 126 and heavily doped n-type drain section 130 within core NMOS region 404 as well as heavily doped n-type source section 180 and heavily doped n-type drain section 184 within output NMOS region 406, as indicated in FIG. 4H.

Figure 4I:
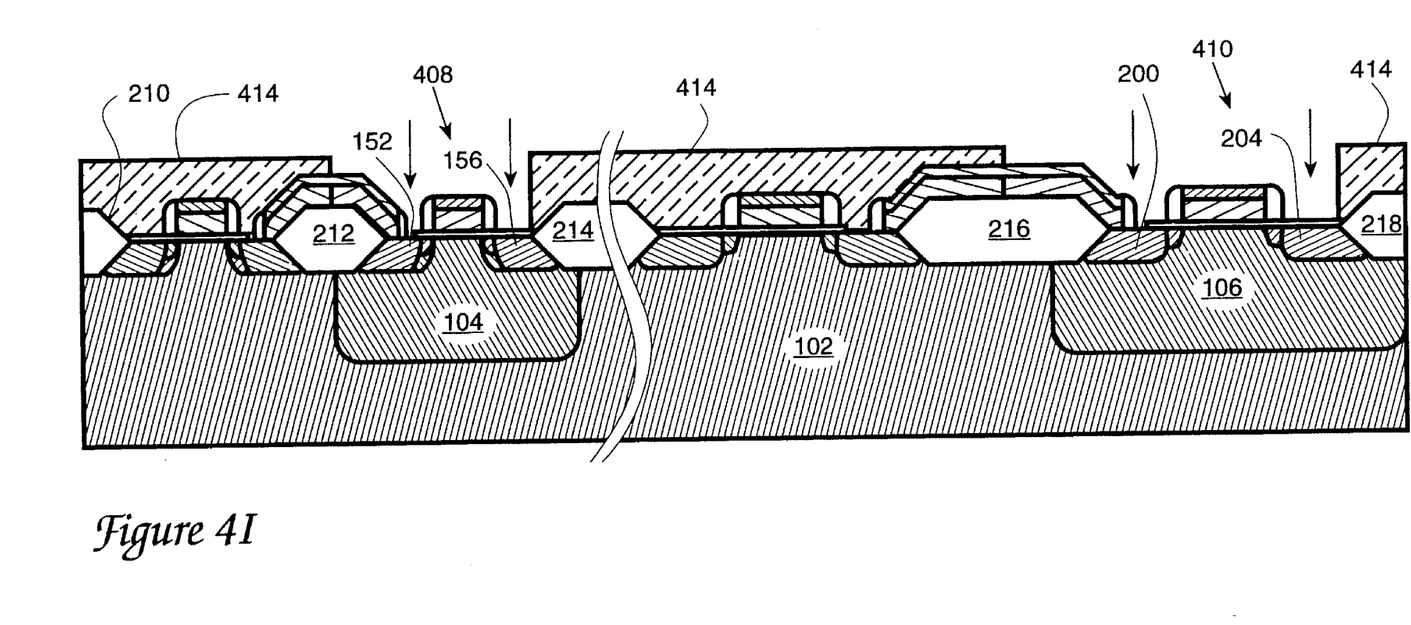

The photoresist 412 is then removed and a new photoresist 414 is applied to pattern substrate 102 with PMOS transistor regions 408 and 410 exposed at step 328; a deep and heavy p-type implant yields heavily doped p-type drain section 152 and heavily doped p-type source section 156 within core PMOS region 408 as well as heavily doped p-type drain section 200 and heavily doped p-type source section 204 within output PMOS region 410, as shown in FIG. 4I.

Through polysilicon definition, interconnect 220 is electrically connected to gates 172 and 192 of output transistors 112 and 114. As a result, the final structure fabricated through method 300 is formed as shown in FIG. 1.

While the steps of method 300 were described in a particular order, those skilled in the art would recognize that some steps can be reordered or modified to yield the same or similar structure. For example, the order of p-type implants and n-type implants in method 300 is reversible. Some of these variations were indicated in the description above.

While the above description emphasizes output transistors, it should be pointed out that other input/output transistors including input transistors and input+output transistors are preferably formed without punch-through implants.

The present invention requires that the core transistors have punch-through implants. In the preferred embodiment, these punch-through implants take the form of the disclosed pockets. An alternative embodiment provides for a punch-through implant to be made before the gate polysilicon is deposited. In such a case the punch-through implant extends the length of the channel region at a depth below the lightly doped drains and sources.

The present invention requires some transistors to have punch-through implants while others do not. Where no pocket sections are employed, the electrostatic charge hardness is enhanced with a reduced gate induced drain leakage I GIDL) between the gate and the drain and good hot-electron hardness. In particular, when a thick-field parasitic transistor (TFO) is used as m ESD protection element, both pocket implant and LDD implant can be skipped because no hot carrier degradation constraint exists in this case.

The term "substrate" as used herein refers to the crystalline semiconductor material that is selectively doped to define various active transistor components. "Substrate" can encompass either or both of a wafer crystal and an expitaxial layer.

The present invention provides for the use of silicon as well as other semiconductor materials. The present invention applies to integrated circuits employing silicon, germanium, gallium arsenide, aluminum gallium arsenide, and other semiconductor materials. Other dielectrics such as silicon nitride can be used as the isolation dielectric. These and other modifications to and variations upon the preferred embodiments are provided for by the present invention, the scope of which is limited only by the following claims.

I claim:

1. In a method of fabricating an integrated circuit structure, the steps of:

a) forming a structure having a silicon substrate and a field oxide thereon, said field oxide leaving exposed a core NMOS region, a core PMOS region, an output NMOS region, and an output PMOS region, said NMOS regions being p-type and said PMOS regions being n-type;

b) after step a, forming a gate oxide layer;

c) after step b, depositing and patterning a polysilicon layer so as to define a core NMOS gate, a core PMOS gate, an output NMOS gate, and an output PMOS gate, said patterning being performed so that the channel lengths of said output gates are greater than the channel lengths of said core gates;

d1) after step c, performing a relatively light and deep p-type implant into said core NMOS region while masking said output NMOS region and said PMOS regions;

d2) after step c, performing a relatively light and deep n-type implant into said core PMOS region while masking said output PMOS region and said NMOS regions;

e) after steps d, forming sidewalls on said gates; and f1) after step e, masking said NMOS regions while leaving exposed said PMOS regions, and peribrining a relatively deep and heavy p-type implant to define a core PMOS drain, a core PMOS source, an output PMOS drain, and an output PMOS source; and f2) after step e, masking said PMOS regions while leaving exposed said NMOS regions, and performing a relatively deep and heavy n-type implant to define a core NMOS drain, a core NMOS source, an output NMOS drain, and an output NMOS source.

2. A method as recited in claim 1 wherein in step c, patterning said polysilicon layer so that the channel lengths of said output gates are at least 0.1 μm greater than the channel lengths of said core gates.

3. A method as recited in claim 1 wherein in step c, patterning said polysilicon layer so that a polysilicon structure defines said output NMOS gate and said output PMOS gate, and electrically connects them to a core NMOS drain and a core PMOS drain.

4. A method as recited in claim 1 further comprising the steps of:

d1) after step c, performing a relatively light and shallow n-type implant into said core NMOS region and said output NMOS region while masking said PMOS regions;

d2) after step c, performing a relatively light and shallow p-type implant into said core PMOS region and said output PMOS region while masking said NMOS region.

5. A method as recited in claim 4 wherein in step d2, said relatively light and deep n-type implant is performed at an angle of at least 30° to a normal to the surface of said substrate.

* * * * *

UNITED STATES PATENT AND TRADEMARK OFFICE
CERTIFICATE OF CORRECTION

PATENT NO. : 5,618,740

DATED : April 8, 1997

INVENTOR(S) : Huang

It is certified that error appears in the above-identified patent and that said Letters Patent is hereby corrected as shown below:

Column 6, line 33, insert -- at step 302 -- between "begins" and "with". Column 6, line 40, change "Formed" to --The formed-- and insert -- the -- before "output". Column 6, line 48, and Column 7, line 7, change p_ -dopant to--p--dopant--. Column 6, line 55, change "412" to --312--. Column 6, line 60, change "remained" to --remaining--. Column 6, line 63, and Column 7, line 2, change "n_ -dopant " to --n--dopant--. Column 7, line 4, change "radically" to --radially--. Column 7, line 11, change "with" to --by--. Column 7, line 30, insert --at step 330, -- before "a deep". Column 8, line 44, in Claim 1, change "peribrining" to --performing--.

Signed and Sealed this

Twenty-seventh Day of January, 1998

Attest:

BRUCE LEHMAN

*Attesting Officer*   *Commissioner of Patents and Trademarks*